United States Patent
Tzivanopoulos et al.

(10) Patent No.: US 9,091,737 B2
(45) Date of Patent: Jul. 28, 2015

(54) ARCHITECTURE OF A BATTERY AND CONTROL DEVICE

(75) Inventors: Chrysanthos Tzivanopoulos, Kornwestheim (DE); Stefan Butzmann, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 534 days.

(21) Appl. No.: 13/508,761

(22) PCT Filed: Nov. 5, 2010

(86) PCT No.: PCT/EP2010/066908
§ 371 (c)(1),
(2), (4) Date: Jul. 30, 2012

(87) PCT Pub. No.: WO2011/057967
PCT Pub. Date: May 19, 2011

(65) Prior Publication Data
US 2012/0282500 A1    Nov. 8, 2012

(30) Foreign Application Priority Data

Nov. 10, 2009    (DE) .................... 10 2009 046 564

(51) Int. Cl.
| | |
|---|---|
| G01R 31/36 | (2006.01) |
| H01M 10/48 | (2006.01) |
| G08B 21/18 | (2006.01) |
| G01R 1/20 | (2006.01) |
| G01R 15/20 | (2006.01) |

(52) U.S. Cl.
CPC ......... *G01R 31/3658* (2013.01); *H01M 10/482* (2013.01); *G01R 1/203* (2013.01); *G01R 15/202* (2013.01)

(58) Field of Classification Search
CPC .. G01R 15/202; G01R 1/203; G01R 31/3658; H01M 10/482
USPC .................... 429/61; 324/434; 340/636.15
See application file for complete search history.

(56) References Cited

U.S. PATENT DOCUMENTS

| | | | |
|---|---|---|---|
| 5,670,861 | A | 9/1997 | Nor |
| 2005/0242775 | A1 | 11/2005 | Miyazaki et al. |
| 2007/0247115 | A1 | 10/2007 | Ishikawa et al. |

FOREIGN PATENT DOCUMENTS

| | | |
|---|---|---|
| DE | 42 25 746 A1 | 2/1994 |
| DE | 195 35 675 A1 | 3/1997 |
| DE | 10 2005 020 835 A1 | 3/2006 |
| DE | 10 2007 029 156 A1 | 1/2009 |
| EP | 1 289 096 A2 | 3/2003 |
| WO | 2009106952 A1 | 9/2009 |
| WO | 2011/057967 A2 | 5/2011 |

OTHER PUBLICATIONS

International Search Report corresponding to PCT Application No. PCT/EP2010/066908, mailed Nov. 14, 2011 (German and English language document) (7 pages).

*Primary Examiner* — Carlos Barcena
(74) *Attorney, Agent, or Firm* — Maginot, Moore & Beck LLP

(57) ABSTRACT

A battery system comprises a battery module, including a high-voltage grid and a low-voltage network having a BCU. The battery module includes a plurality of battery cells connected in series and a plurality of cell monitoring units configured to measure and to transmit battery voltages of the battery cells with respect to a first control signal. The BCU is configured to determine a charge state of the battery cells. The BCU includes a microcontroller and a nanocontroller. The nanocontroller is or can be directly connected to the cell monitoring units and is connected to the microcontroller by means of an isolator, and is configured to generate the first control signal and to transmit the signal to the cell monitoring units and to receive the battery voltages of the battery cells transmitted by the cell monitoring units and relay same to the microcontroller.

15 Claims, 4 Drawing Sheets

ARCHITECTURE OF A BATTERY AND CONTROL DEVICE

This application is a 35 U.S.C. §371 National Stage Application of PCT/EP2010/066908, filed on Nov. 5, 2010, which claims the benefit of priority to Serial No. DE 10 2009 046 564.2, filed on Nov. 10,2009 in Germany, the disclosures of which are incorporated herein by reference in their entirety.

BACKGROUND

There is a growing demand for battery systems which are intended to be used in fixed applications such as wind power installations and emergency power systems or else in vehicles. All these demands result in stringent requirements in terms of the reliability and fail safety. The reason for this is that complete failure of the voltage supply provided by the battery system can lead to a failure of the entire system. Therefore, in wind power installations batteries are used in order to adjust the rotor blades when the wind is strong and in this way to protect the installation against excessive mechanical loads which can damage or even destroy the wind power installation. If the battery of an electric car were to fail, the car would become undrivable. In turn, an emergency power system is intended in fact to ensure uninterrupted operation of, for example, a hospital, and therefore itself cannot possibly fail.

In order to be able to make available the power and energy which is required for the respective application, individual battery cells in a battery module are connected in series and partially additionally in parallel, wherein a high overall voltage is produced which constitutes a source of hazards and has to be protected. Therefore, two main contactors are usually provided, which disconnect the positive and the negative poles of the battery module in response to a corresponding control signal and in this way connect the battery module to the outside in a voltage-free fashion.

In order to monitor the battery cells, a so-called control unit or battery control unit (BCU) is used which has a microcontroller as a central component. The BCU is operated in a low voltage network and therefore has to be isolated from the high voltage network with the battery module. However, at the same time the microcontroller of the BCU must receive current measurement data from the battery cells (or cell monitoring units which are arranged in the battery module and which measure the various battery parameters), in order, for example, to determine the state of charge or state of ageing thereof or the overall voltage of the battery module, with the result that communication has to be possible between the high voltage network and the low voltage network despite the requirement for isolation. Since the cell monitoring units are connected in terms of potential to the high voltage network, but the microcontroller of the BCU is connected to the low voltage network, the cell monitoring units are typically connected to the microcontroller via an isolation module or isolator. FIG. 1 and FIG. 2 show examples of such an arrangement.

In the example in FIG. 1, an isolator 14 is arranged in the high voltage network and is connected to a cell monitoring unit 12-1 of a plurality of cell monitoring units 12-1 to 12-n. The cell monitoring units 12-1 to 12-n are each connected to a battery cell or a group of battery cells 11-1 to 11-n. A communication bus, to which all the cell monitoring units 12-1 to 12-n are connected, is made to extend via the isolator 14 and from the high voltage network into the low voltage network to the microcontroller 15. The microcontroller 15 is connected to two main contactors 16-1 and 16-2, which, in response to a control signal of the microcontroller 15, disconnect the battery cells 11-1 to 11-n or connect them to a load. The microcontroller 15 is connected to further electronic units via a Control Area Network (CAN) bus 17 or a similar communication line. Alternatively, the isolator 15 can be arranged in the low voltage network, for example on the BCU, as is shown in the example in FIG. 2, wherein identical reference signs denote identical components.

The two solutions shown in FIGS. 1 and 2 have the disadvantage that the isolator 14 entails high costs because it usually has to be implemented as an SPI bus isolator.

FIG. 3 shows a further previously known solution in which an additional microcontroller 13 is integrated into a cell monitoring unit 12-1, said microcontroller 13 communicating with the microcontroller 15 of the BCU via an isolator 14 which is arranged in the low voltage network. This solution has the disadvantage that one of the cell monitoring units has to be configured differently than the cell monitoring units for the remaining battery cells, but on the other hand the abovementioned problem of the high costs for the isolator 14 is eliminated here since a CAN bus can be used for communicating over the boundary between the high voltage network and the low voltage network. However, using a CAN bus has in turn the disadvantage that the synchronization of the battery voltages measured by the cell monitoring units in the high voltage network with the measurement of the battery current which is usually carried out in the low voltage network is difficult owing to the communication via the CAN bus.

In addition, complex safety mechanisms, which ensure that the microcontroller 15 functions correctly at all times since the Li ion batteries used constitute a considerable potential hazard, have to be provided in all three examples of previously known battery systems.

SUMMARY

The disclosure solves the above-mentioned disadvantages of the prior art by means of a battery system having a high voltage network comprising a battery module and a low voltage network comprising a BCU, wherein the battery module has a plurality of battery cells connected in series and a plurality of cell monitoring units. The cell monitoring units are designed to measure battery voltages of the battery cells in response to a first control signal and to transmit said battery voltages. The BCU is designed to determine a state of charge of the battery cells. According to the disclosure, the BCU comprises a microcontroller and a nanocontroller, wherein the nanocontroller is or can be directly connected to the cell monitoring units and is connected to the microcontroller via an isolator. The nanocontroller is designed here to generate the first control signal and to transmit it to the cell monitoring units and to receive the battery voltages of the battery cells which are transmitted by the cell monitoring units, and to relay said battery voltages to the microcontroller.

According to the disclosure the cell monitoring units communicate with the nanocontroller. The battery system of the disclosure has here the advantage that a bus can be used for the communication between the nanocontroller and the microcontroller, said bus permitting the use of a relatively inexpensive isolator. The communication between the nanocontroller and the microcontroller is not time-critical because the battery voltages which are measured by the cell monitoring units can already be pre-processed by the nanocontroller, and the time of the measurements by said nanocontroller can be determined precisely without communication via an isolator and therefore without a delay. In addition, all the cell monitoring units can be of identical design, which makes the development and production of specific cell monitoring units, as in the example in FIG. 3, superfluous and makes the battery system more cost-effective. A microcontroller is referred to here as a "nanocontroller", wherein the term is intended to indicate that a microcontroller with relatively lower computing power than that of the microcontroller contained in the BCU can be used because the nanocontroller performs relatively simple tasks which make low demands of the computing power.

A battery system is preferred in which the nanocontroller is connected to the microcontroller of the BCU via the isolator by means of a CAN bus.

The nanocontroller is particularly preferably connected to a first current sensor, preferably a shunt resistor with an evaluation unit connected downstream, which shunt resistor is designed to measure a current through the battery module in response to a second control signal, and to transmit a current measurement result to the nanocontroller. In this embodiment, the nanocontroller controls not only the measurement of the battery voltages by the cell monitoring units but also the measurement of the current by the battery module. As a result it becomes possible to carry out the two measurements with a high degree of synchronicity, which increases the accuracy of the determination of the state of charge or state of ageing of the battery cells. One embodiment of the battery system according to the disclosure is therefore preferred in which the nanocontroller is designed to generate the first and the second control signals synchronously.

The nanocontroller can additionally be designed to determine the state of charge of the battery cells. In this case, the nanocontroller carries out one of the tasks of the microcontroller of the BCU redundantly, which increases the fail safety.

The nanocontroller can also be designed to compare the battery voltages with a predefined limiting value, and to generate a first alarm signal when the predefined limiting value is exceeded. This is a task which is usually performed by the microcontroller of the BCU, with the result that the additional monitoring of the battery voltages by the nanocontroller increases the safety in the case of a failure of the microcontroller of the BCU.

The nanocontroller and the microcontroller are particularly preferably designed to transmit monitoring messages to one another at regular intervals and to generate a second alarm signal if a response to a monitoring message fails to occur. If the nanocontroller receives a monitoring message from the microcontroller, it responds within an agreed time period with a response. The microcontroller behaves correspondingly with monitoring messages received from the nanocontroller. If a response fails to occur it is probable that a processing error has occurred on the respective other side and this other side can no longer perform, or can no longer reliably perform, its monitoring tasks, for which reason that part which detects the failure of the other side triggers an alarm, in response to which suitable measures can be initiated in the battery system or by an operator.

The microcontroller is preferably connected to a second current sensor, preferably a Hall sensor, which is designed to measure a current through the battery module in response to a third control signal, and to transmit a current measurement result to the microcontroller. In this way it becomes possible for the current through the battery module to be determined directly by the microcontroller in addition to the determination by the nanocontroller by means of the first current sensor, as a result of which the latter is monitored more independently of the functioning of the nanocontroller and the battery current is monitored redundantly, as a result of which the safety of the battery system is increased. The second current sensor is preferably embodied as a Hall sensor because in this way the BCU which forms part of the low voltage network can remain electrically isolated from the parts which conduct a high voltage.

The battery system can have a first main contactor, connected between a first pole of the battery cells connected in series and a first output of the battery module, and a second main contactor, connected between a second pole of the battery cells connected in series and a second output of the battery module. The first main contactor here preferably has a control input connected to the nanocontroller, and the second main contactor has a control input connected to the microcontroller. The nanocontroller and the microcontroller are designed here to control opening and closing of the first and/or second main contactor. In this embodiment, the nanocontroller and the microcontroller each monitor one of the main contactors. If one of the processing units (nanocontroller or microcontroller) fails and as a result one of the two main contactors is not opened, the respective other processing unit will notice this and trigger a suitable reaction. For this purpose, in one particular embodiment of the disclosure the nanocontroller is additionally connected to the control input of the second main contactor, and the microcontroller is additionally connected to the control input of the first main contactor, wherein the nanocontroller and the microcontroller are designed to open the second main contactor and/or the first main contactor (that is to say the respective other main contactor) if the microcontroller and/or the nanocontroller fail. The determination that the respective other processing unit has failed can be made at the latest when the cell voltages and the battery current are no longer in uncritical regions. Furthermore, a combination with the above-mentioned exemplary embodiment is particularly attractive in which the nanocontroller and the microcontroller monitor one another by means of monitoring messages and responses.

BRIEF DESCRIPTION OF THE DRAWINGS

The disclosure will be explained in more detail below with reference to the drawings. In the drawings.

DETAILED DESCRIPTION

Figure 1:
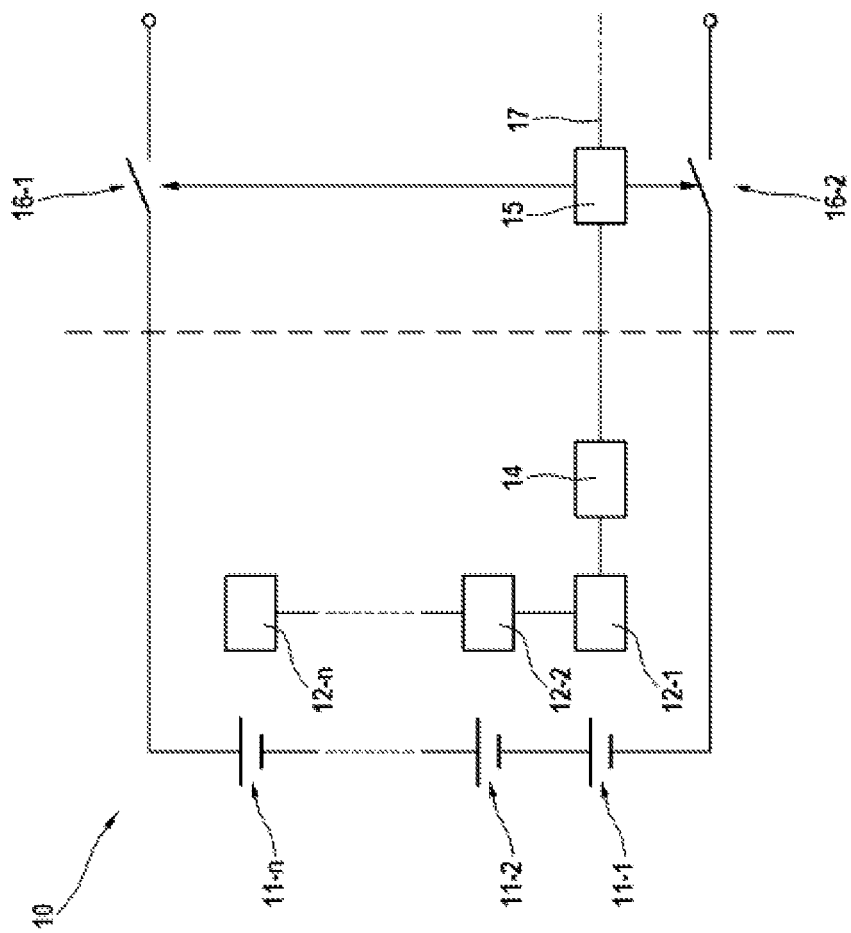
FIG. 1 shows a high voltage network and a low voltage network with an isolator arranged in the high voltage network and connected to a cell monitoring unit.
Figure 2:
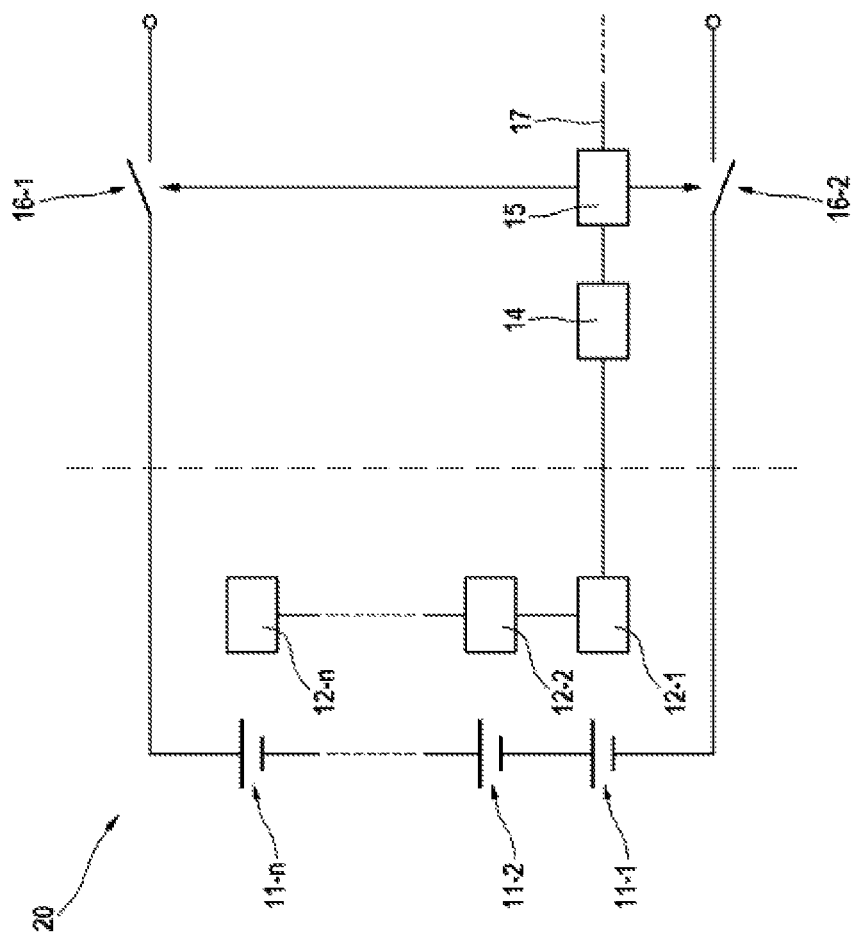
FIG. 2 shows a high voltage network and a low voltage network with an isolator arranged in the low voltage network.
Figure 3:
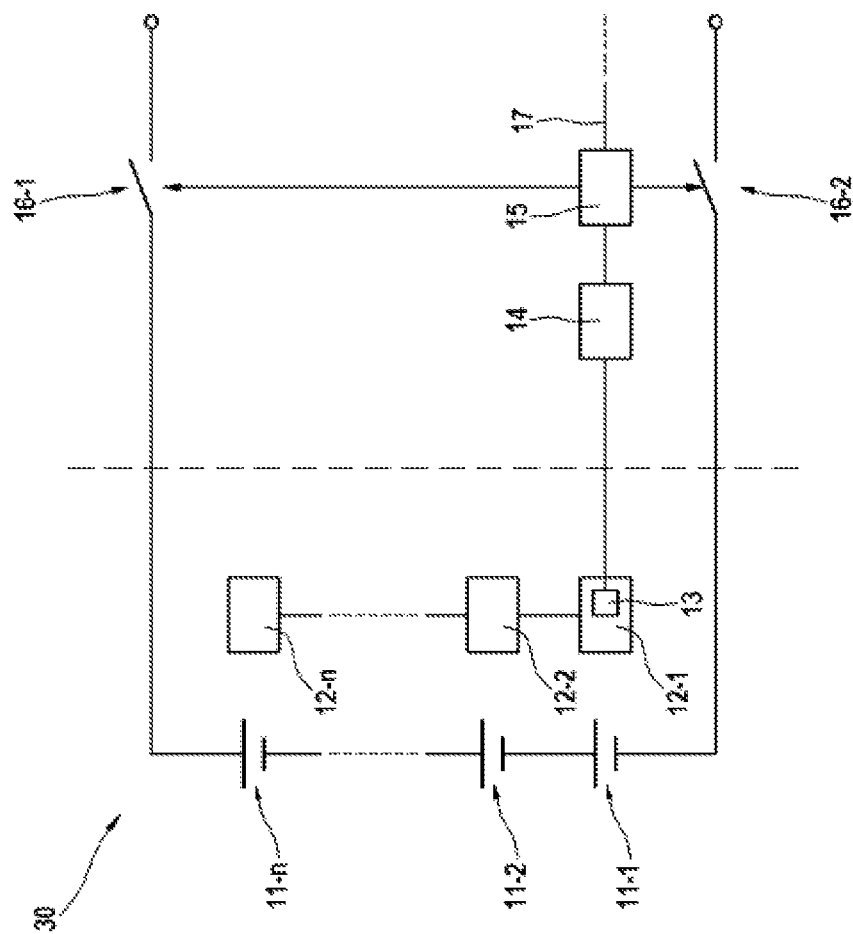
FIG. 3 shows a high voltage network and a low voltage network with an isolator arranged in the low voltage network and a microcontroller integrated into a cell monitoring unit.
Figure 4:
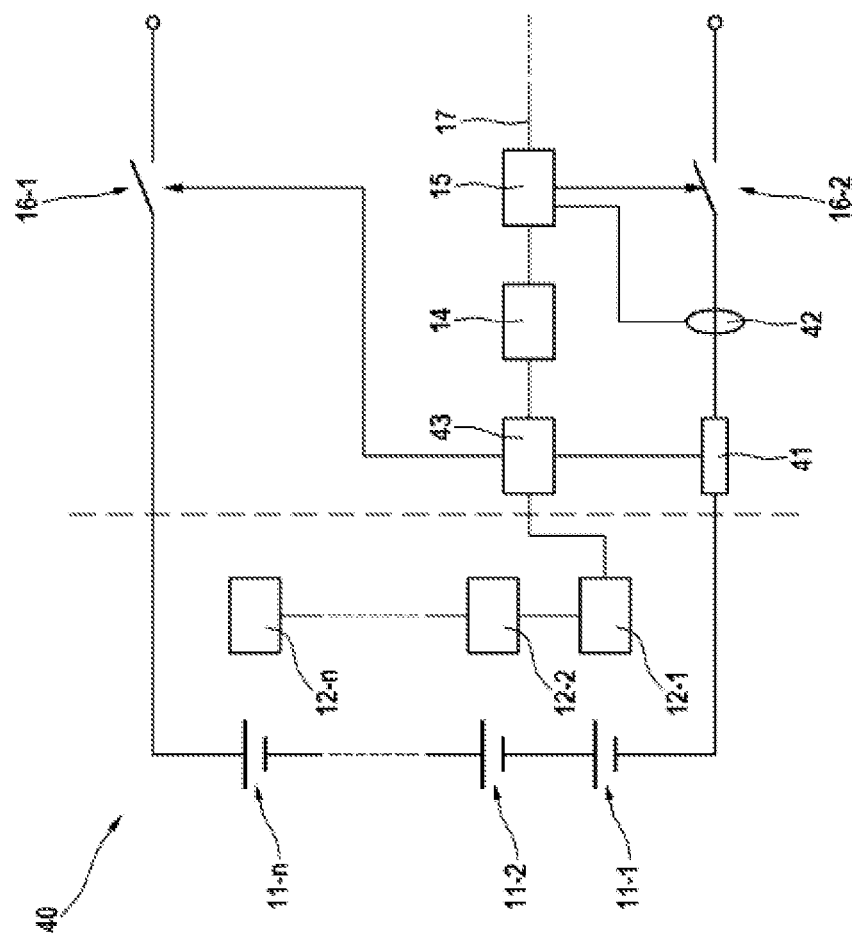
FIG. 4 shows an exemplary embodiment of the disclosure.

FIG. 4 shows an exemplary embodiment of the disclosure. Identical reference symbols to those in the previous figures denote identical elements. The battery system 40 in FIG. 4 has a high voltage network which comprises a battery module with a plurality of battery cells 11-1 to 11-n which are connected in series and cell monitoring units 12-1 to 12-n which are assigned to the battery cells. The cell monitoring units 12-1 to 12-n are designed to determine battery voltages of the battery cells 11-1 to 11-n. Furthermore, the cell monitoring units 12-1 to 12-n can be designed to determine further battery parameters such as, for example, the cell temperature. The cell monitoring units 12-1 to 12-n communicate via a bus with a nanocontroller 43 which is arranged in the low voltagenetwork of the battery system 40. The nanocontroller 43 brings about measurements by the cell monitoring units 12-1 to 12-n and receives the measurement results therefrom. In order to satisfy the requirement for sufficient protection of the high voltage network, the nanocontroller 43 communicates with a microcontroller 15 via an isolator 14. The communication here is preferably executed via a CAN bus which permits the use of a particularly inexpensive isolator 14. In the example illustrated, the nanocontroller 43 has a control output to one of the two main contactors 16-1 and 16-2, while the other main contactor 16-1, 16-2 is connected to the microcontroller 15. Each of the two processing units therefore performs the controlling of one of the main contactors 16-1, 16-2 in each case. The nanocontroller 43 is connected to a first current sensor 41 which is embodied as a shunt resistor with an electronic evaluation system connected downstream and can therefore determine, by means of the shunt resistor, the current through the battery module or the battery cells 11-1 to 11-n in synchronism with the measurement of the battery voltages of the battery cells 11-1 to 11-n. In addition to this, a second current sensor 42 which is embodied as a Hall sensor is provided, which current sensor 42 is connected to the microcontroller 15 and is controlled thereby, which permits the redundant determination of the battery current and provides, for example, a relatively high degree of reliability for the protection against short circuits of the battery module. The microcontroller 15 can be connected to further components via a CAN bus 17 or a similar communication bus. Depending on the embodiment, the nanocontroller 43 and the microcontroller 15 can actuate the main contactors 16-1, 16-2 via what are referred to as power drivers, which make available sufficient power for actuating the main contactors 16-1, 16-2 which are embodied, for example, as relays. The battery system can also have what are referred to as watchdogs for the microcontroller 15 and/or the nanocontroller 43, which ensure the correct method of functioning thereof in a known fashion.

The invention claimed is:

1. A battery system comprising:
   a high voltage network including a battery module, the battery module having a plurality of battery cells connected in series and a plurality of cell monitoring units configured to measure battery voltages of the battery cells in response to a first control signal; and
   a low voltage network including a BCU, the BCU configured to determine a state of charge of the battery cells and the BCU having:
   a microcontroller; and
   a nanocontroller directly connected to the plurality of cell monitoring units and operatively connected to the microcontroller via an isolator and configured to:
   generate the first control signal,
   transmit the first control signal to the cell monitoring units,
   receive the battery voltages of the battery cells from the cell monitoring units, and
   provide the battery voltages to the microcontroller.

2. The battery system as claimed in claim 1, wherein the nanocontroller is connected to the microcontroller via the isolator by means of a CAN bus.

3. The battery system as claimed in claim 1, wherein:
   the nanocontroller is connected to a first current sensor, the first current sensor is configured to measure a current through the battery module in response to a second control signal and the nanocontroller is further configured to generate the second control signal and to transmit the current measurement result to the nanocontroller.

4. The battery system as claimed in claim 3, wherein the nanocontroller is further configured to generate the first and the second control signals synchronously.

5. The battery system as claimed in claim 3, wherein the first current sensor is a shunt resistor having an evaluation unit connected downstream.

6. The battery system as claimed in claim 1, wherein the nanocontroller is further configured to determine the state of charge of the battery cells.

7. The battery system as claimed in claim 1, wherein the nanocontroller is further configured to compare the battery voltages with a predefined limiting value and to generate a first alarm signal if the battery voltages exceed the predefined limiting value.

8. The battery system as claimed in claim 1, wherein the nanocontroller is further configured to transmit monitoring messages to the microcontroller at regular intervals and to receive a response from the microcontroller.

9. The battery system as claimed in claim 8, wherein the nanocontroller is further configured to generate a second alarm signal if the nanocontroller does not receive the response from the microcontroller.

10. The battery system as claimed in claim 8, wherein the microcontroller is further configured to generate a second alarm signal if the microcontroller does not receive the response from the nanocontroller.

11. The battery system as claimed in claim 1, wherein the microcontroller is connected to a second current sensor configured to measure a current through the battery module in response to a third control signal, and to transmit the current measurement result to the microcontroller.

12. The battery system as claimed in claim 11, further comprising:
    a first main contactor, operatively connected between a first pole of the battery cells and a first output of the battery module, the first main contactor includes a first control input operatively connected to the nanocontroller; and
    a second main contactor, operatively connected between a second pole of the battery cells and a second output of the battery module, the second main contactor includes a second control input operatively connected to the microcontroller,
    the nanocontroller and the microcontroller are configured to control opening and closing of at least one of the first and second main contactor.

13. The battery system as claimed in claim 12, wherein:
    the nanocontroller is operatively connected to the second control input of the second main contactor,
    the microcontroller is operatively connected to the first control input of the first main contactor, and
    at least one of the nanocontroller and the microcontroller further configured to open at least one of the second main contactor and the first main contactor if at least one of the microcontroller and the nanocontroller fail.

14. The battery system as claimed in claim 11, wherein the second current sensor is a Hall sensor.

15. The battery system as claimed in claim 1, wherein the microcontroller is configured to transmit monitoring messages to the nanocontroller at regular intervals and to receive a response from the nanocontroller.

* * * * *